United States Patent
Nauth et al.

(10) Patent No.: US 10,236,881 B2
(45) Date of Patent: Mar. 19, 2019

(54) INPUT DEVICE WITH A TWO-PART FORCE SENSOR FOR ACTUATION INPUTS AND METHOD FOR THE PRODUCTION THEREOF

(71) Applicant: PREH GMBH, Bad Neustadt A.D. Saale (DE)

(72) Inventors: Juergen Nauth, Stangenroth (DE); Sara Hofmann, Wuelfershausen (DE); Jochen Schlereth, Sondheim (DE)

(73) Assignee: PREH GMBH, Bad Neustadt A.D. Saale (DE)

( * ) Notice: Subject to any disclaimer, the term of this patent is extended or adjusted under 35 U.S.C. 154(b) by 0 days.

(21) Appl. No.: 15/610,635

(22) Filed: Jun. 1, 2017

(65) Prior Publication Data

US 2017/0353182 A1    Dec. 7, 2017

(30) Foreign Application Priority Data

Jun. 6, 2016    (DE) .................. 10 2016 110 434
Sep. 13, 2016    (DE) .................. 10 2016 010 971

(51) Int. Cl.
*H03K 17/975* (2006.01)
*G01D 5/241* (2006.01)

(52) U.S. Cl.
CPC ......... *H03K 17/975* (2013.01); *G01D 5/2417* (2013.01)

(58) Field of Classification Search
CPC .................. H03K 17/975; G01D 5/2417
USPC ......................................................... 200/600
See application file for complete search history.

(56) References Cited

U.S. PATENT DOCUMENTS

| | | |
|---|---|---|
| 4,562,315 A | 12/1985 | Aufderheide |
| 2012/0217147 A1 | 8/2012 | Porter et al. |
| 2014/0252882 A1* | 9/2014 | Dinh ............... H01H 13/06 307/125 |

FOREIGN PATENT DOCUMENTS

DE    10 2014 111 562 A1    2/2016

* cited by examiner

*Primary Examiner* — Edwin A. Leon
*Assistant Examiner* — Lheiren Mae A Caroc
(74) *Attorney, Agent, or Firm* — Norman B. Thot

(57) ABSTRACT

An input device includes a first component with an actuating layer and a first electrode arranged adjacent thereto, a second component with a carrier and a second electrode, and a device which electrically contacts the first and second electrodes. The first and second electrodes face each other with an air gap therebetween. The first electrode, under an influence of an actuating force acting on the actuating surface undergoes, upon an actuation, a displacement so as to move the first electrode closer to the second electrode against an elastic restoring force. A detection and evaluation device applies a measuring capacitance to the first and second electrodes and detects a change in the measuring capacitance dependent on the displacement moving the first and second electrodes closer to each other in order to associate the actuation with a switching or controlling function after detecting a predetermined change in the measuring capacitance.

19 Claims, 3 Drawing Sheets

INPUT DEVICE WITH A TWO-PART FORCE SENSOR FOR ACTUATION INPUTS AND METHOD FOR THE PRODUCTION THEREOF

CROSS REFERENCE TO PRIOR APPLICATIONS

Priority is claimed to German Patent Application No. DE 10 2016 110 434.5, filed Jun. 6, 2016 and to German Patent Application No. DE 10 2016 010 971.8, filed Sep. 13, 2016. The entire disclosures of said applications are incorporated by reference herein.

FIELD

The present invention relates to an input device with a force sensor.

BACKGROUND

Force sensors formed from a film layer structure are presently used to detect actuating forces. A problem with these sensors is that they are highly sensitive to temperature fluctuations and the ingress of moisture. An additional problem is that the film layer structure, which is embedded or clamped between two components only in some areas, can be distorted considerably. There is also the problem that the layer structure is difficult to mount in a bubble-free manner because insufficient mechanical fixation can be applied in those areas provided for force detection due to the mobility required for force detection.

SUMMARY

An aspect of the present invention is to provide an input device with a force sensor in which a greater reliability of force detection is obtained, in particular in permanent use and in adverse conditions, such as with high and low temperatures, high temperature fluctuations, and/or high air humidity.

In an embodiment, the present invention provides an input device which includes a first component comprising an actuating layer and a first electrode arranged adjacent to the actuating layer, the actuating layer defining an actuating surface, a second component comprising a carrier and a second electrode, the first electrode and the second electrode being arranged to face each other, an air gap arranged between the first electrode and the second electrode, a fastener configured to connect the first component and the second component, a device configured to electrically contact the first electrode and the second electrode, and a detection and evaluation unit. The first electrode, under an influence of an actuating force acting on the actuating surface undergoes, upon an actuation, a displacement so as to move the first electrode closer to the second electrode against an elastic restoring force. The detection and evaluation device is configured to apply a measuring capacitance to the first electrode and to the second electrode, and to detect a change in the measuring capacitance dependent on the displacement moving the first electrode and the second electrode closer to each other in order to associate the actuation with a switching or controlling function after detecting a predetermined change in the measuring capacitance.

BRIEF DESCRIPTION OF THE DRAWINGS

The present invention is described in greater detail below on the basis of embodiments and of the drawings in which.

DETAILED DESCRIPTION

Figure 1:
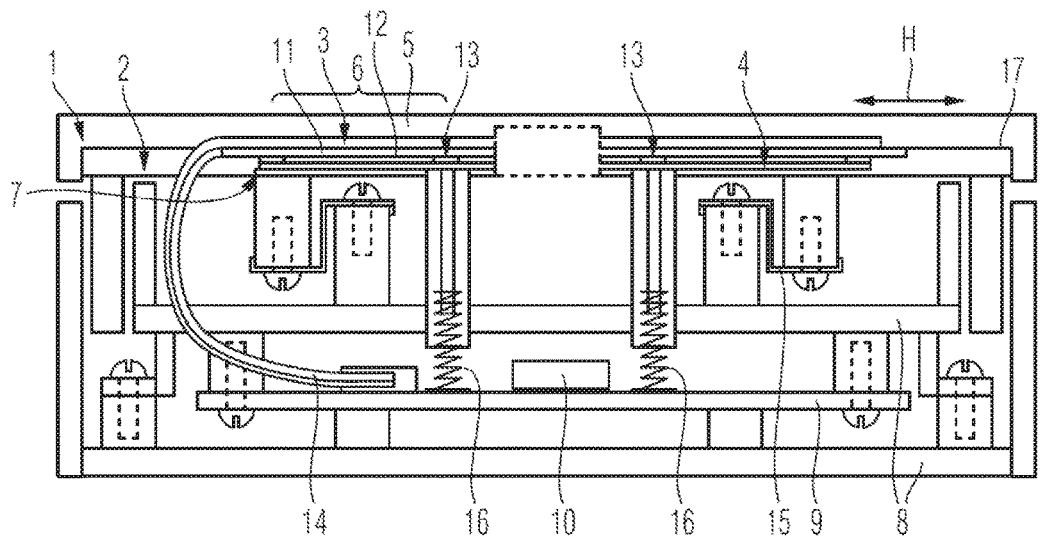
FIG. 1 shows a sectional view through a first embodiment of the input device according to the present invention.

The present invention relates to an input device which has at least a two-part structure and comprises at least a first component and a second component. The first component defines a planar or curved actuating surface. From the user's point of view, an actuating layer of the first component is provided underneath the actuating surface. A first, flat electrode is disposed adjacent to the actuating layer. The term electrode implies that the electrode is substantially made from a conductive material, such as a conductive plastic or a metal or a metallic alloy. The electrode can, for example, be a film with a conductive layer, for example, a plastic film. The film can, for example, be a single-ply layer structure. The first electrode can, for example, be attached to the first component by a non-positive and/or a substance-to-substance connection, for example, glued thereto. The present invention also provides a second component with a carrier and with a second flat electrode made of a conductive material. By associating the electrodes and by optionally attaching them via respective components, a film layer structure which attempts to reciprocally fix the electrodes, with all the drawbacks set forth above, can be avoided. The reliability of a generic input device will thus be enhanced.

The present invention further provides a fastener to connect the first and second components rigidly or, optionally, with a clearance. A latching device or a screwing device can, for example, be understood to be a fastener in the sense of the present invention; any substance-to-substance connection, non-positive connection, or positive connection can also be understood to be the fastener between the first and the second components in the sense of the present invention.

According to the present invention, the first flat electrode and the second electrode face each other, at least over an air gap. The first flat electrode and the second electrode can optionally also be spaced apart from each other by an additional electrically insulating protective layer.

The present invention provides that the first electrode, under the influence of an actuating force acting on the actuating surface upon actuation, undergoes a displacement so as to move the first electrode closer to the second electrode against an elastic restoring force. It can, for example, be provided that the elastic restoring force is substantially provided by an elastic deformation of the first component. The restoring force is substantially provided by an elastic deformation of the actuating layer. In another embodiment, the movement closer can, for example, be made possible, or the restoring force can, for example, substantially be provided by an elastic deformation of the second component, for example, an elastic deformation of the second electrode.

The present invention provides a device for electrically contacting the first and second electrodes. The device for electrical contacting can, for example, comprise a flexible conductor path.

The present invention also provides a detection and evaluation unit for applying a measuring capacitance to the first and second electrodes and for detecting a change in measuring capacitance dependent on the actuation force in order to associate the actuation with a switching or controlling function after detecting a predetermined change in measuring capacitance.

In an embodiment of the present invention, at least the carrier of the second component and the actuating layer of the first component can, for example, be made of a plastic, for example, a thermoplastic material. At least one electrode of the first and second electrodes can, for example, be made of a conductive plastic.

In an embodiment of the present invention, at least one electrode of the first and second electrodes can, for example, be defined by a metallic coating or a metal sheet. The second electrode can, for example, be a metal sheet.

Spacers can, for example, be disposed in some areas of the air gap to improve the elastic restoration of the actuating layer after the elimination of the actuating force, the spacers being connected to the first or second component by a non-positive and/or a substance-to-substance connection. The spacers can, for example, be made of plastic. The spacers can, for example, not be disposed directly underneath the actuating surface, but can be laterally offset thereto.

In an embodiment of the present invention, the input device can, for example, comprise a housing, a support, for example, spring plates, to support the first and second components movably relative to the housing, and an actuator for stimulating movement of the first and second components relative to the housing to generate a tactile feedback.

In an embodiment of the present invention, the device for electrically contacting the first and the second electrodes can, for example, comprise the support. At least one of the first and second electrodes can, for example, be electrically contacted via the above-mentioned spring plates.

In an embodiment of the present invention, the first and/or the second component, for example, only the first component, can, for example, have an array of electrodes which are electrically insulated from one another. This array serves for the spatially resolving detection of the actuating force, but may also be used for spatially resolving touch detection in another embodiment.

In an embodiment of the present invention, a guide with a restricting link can, for example, be further provided in order to obtain in the non-actuated position (rest position), i.e., in the state of maximum distance between the first component and the second component, a specified positioning between these components and thus of the associated electrodes. Fluctuations of the measuring capacitance determined by the two electrodes and their relative orientation are thus minimized in the rest position. A wedge-shaped projection can, for example, extend into a recess or, for example, into a groove narrowing towards its bottom.

The present invention also relates to the use of the input device in one of the above-described embodiments in a motor vehicle.

The present invention also relates to a method for producing an input device, for example, in one of the above-described embodiments, wherein the first and second components are produced in two independent steps, and the first and second components are connected to each other in a subsequent step using the fastener.

In an embodiment of the present invention, at least one of the first and second components can, for example, be produced in an injection-molding process, for example, via a 2K injection-molding process or an injection-molding process injection-overmolding the respective electrode.

The present invention is explained in greater detail below under reference to the drawings.

FIG. 1 shows a first embodiment of the input device according to the present invention. The input device has a first component 1 and a second component 2 which are glued to each other via an adhesive layer 17. The first component 1 has an actuating layer 5 defining an actuating surface 6 that faces an operator (who is not shown in the drawings). The actuating layer 5 is made from a thermoplastic material which is elastically deformable. A first (flat) electrode 3 made from a conductive material is provided adjacent to the actuating layer. In the shown embodiment, the first electrode 3 is defined by a layer of a film layer structure glued to the actuating layer 5 of the first component 1. The film layer structure also has a protective layer 11 disposed on the side of the first electrode 3 facing away from the actuating surface 6, adjacent to the first electrode 3. The second component 2 has a carrier 7 which, from the standpoint of the operator, is disposed underneath the first component 1. An array of several second (flat) electrodes 4 consisting of a metal sheet is applied to the carrier 7. An air gap 12 is formed between the first component 1, in particular between its first electrode 3, and between the second component 2, in particular its second electrode 4. The first electrode 3 is electrically contacted via a flexible conductor path 14. Each individual second electrode 4 of the array of second electrodes 4 is in each case electrically contacted via a contact spring 16. The first electrode 3 and the second electrode 4 face each other and are spaced apart from each other by the air gap 12 and additionally by the electrically insulating protective layer 11. Under the influence of an actuating force acting on the actuating surface 6, the first electrode 3 undergoes a displacement moving it closer to the second electrode 4, against an elastic restoring force produced by the actuating layer 5. This movement closer to each other is detected capacitively. A detection and evaluation unit 10 for applying a measuring capacitance to the first electrode 3 and the second electrode 4 via the flexible conductor path 14 or the associated contact spring 16 is provided therefor. The detection and evaluation unit 10 is provided to associate the actuation with a switching or controlling function upon detecting a change in measuring capacitance dependent on the displacement moving the first electrode 3 and the second electrode 4 closer to each other. Spacers 13 are also provided between the first component 1 and the second component 2, which, corresponding to the array of second electrodes 4, provide for a mechanical separation of the actuating surface 6 and thus enable a spatial resolution in the detection of the detection of the actuating force corresponding to the spatial relationship of the array. The detection and evaluation unit 10 is mounted on a printed circuit board 9 which is in turn is attached to a housing 8 belonging to the input device. The unit consisting of the first component 1 and the second component 2 is movably supported in an elastically restoring manner in a direction parallel to the actuating surface 6. Several leaf springs 15 are provided therefor which provide for horizontal mobility while at the same time providing the restoring action. This mobility of the first component 1 and the second component 2 is used to provide a tactile feedback by an actuated stimulation of movement H of the actuating surface 6 when a minimum actuating force is exceeded. The associated actuator is not depicted.

Figure 2:
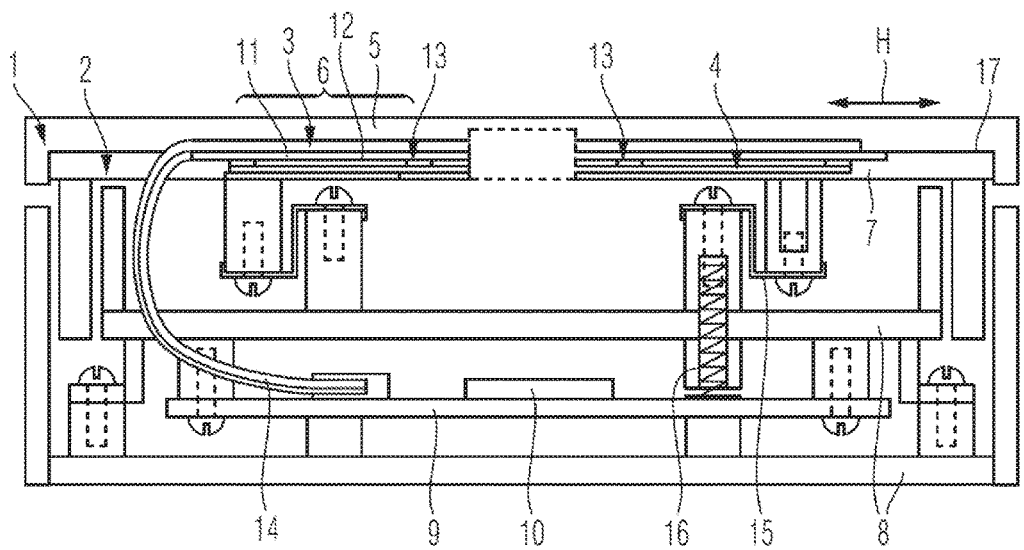
FIG. 2 shows a sectional view through a second embodiment of the input device according to the present invention.

The second embodiment shown in FIG. 2 is substantially identical to the first embodiment shown in FIG. 1. The elastic restoring action for detecting the actuating force is thus also in this case provided by an elastic deformation of the actuating layer 5. Electric contacting is in this case effected using the support, in this case the leaf spring 15, required for the movable support of the first component 1 and the second component 2 and to generate the tactile feedback.

Figure 3:
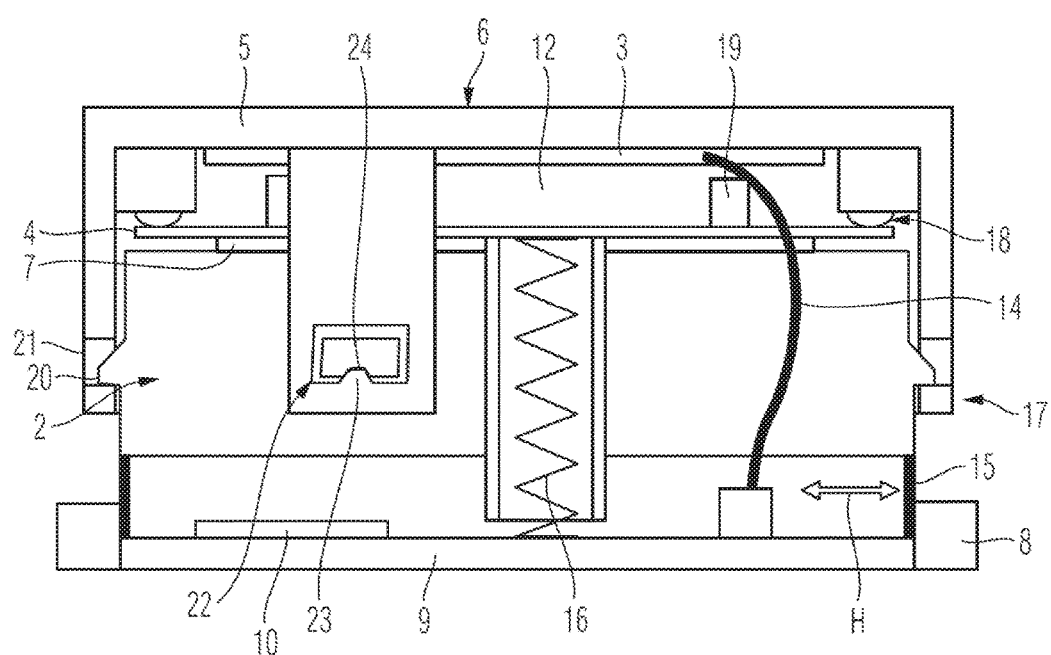
FIG. 3 shows a sectional view through a third embodiment of the input device according to the present invention.
Figure 4:
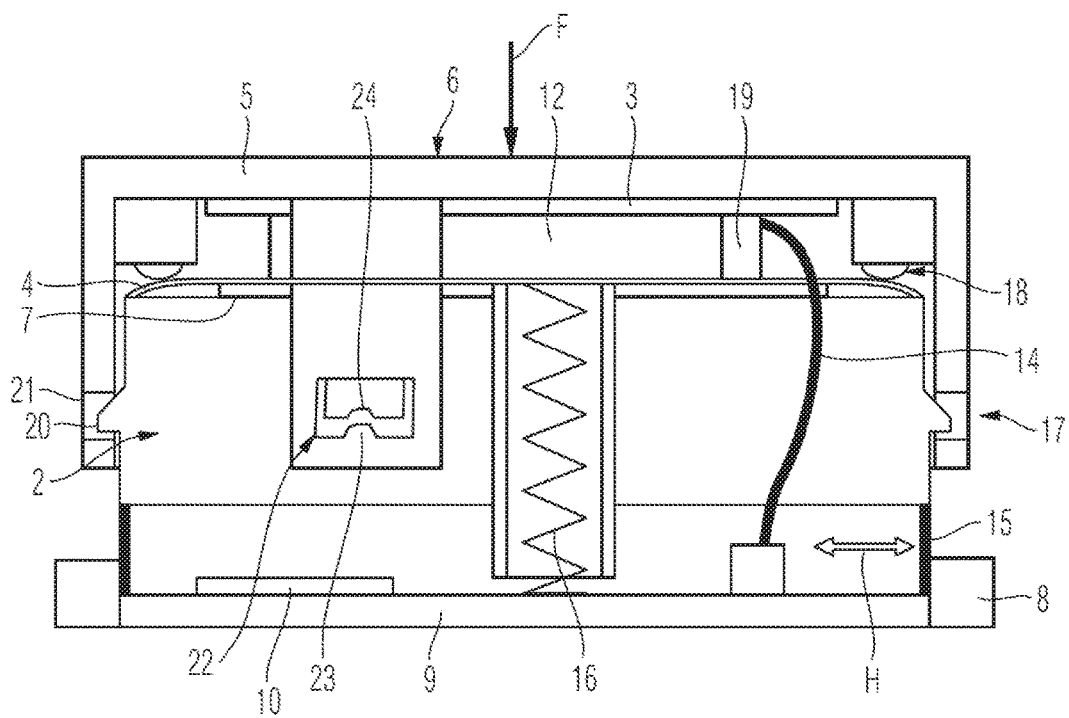
FIG. 4 shows an exploded view of the third embodiment.

FIGS. 3 and 4 show a third embodiment of the input device according to the present invention. FIG. 4 is an illustration of this embodiment in which an actuating force F acts on the actuating surface 6. The third embodiment of the input device has a first component 1 and a second component 2 which are not glued to each other via an adhesive layer, but are fixed to each other via a latching connection 17. The latching connection has a clearance via a latching lug 20 engaging a latching opening 21 that is oversized in comparison with the latching lug 20. The first component 1 has an actuating layer 5 defining an actuating surface 6 that faces an operator (who is not shown in the drawings). A first electrode 3 made from a conductive material is provided adjacent to the actuating layer 5. In the shown embodiment, the first electrode 3 is defined by a metal sheet glued to the actuating layer 5 of the first component 1. A film with a conductive layer would alternatively be conceivable. The second component 2 has a carrier 7 which, from the standpoint of the operator, is disposed underneath the first component 1. A second electrode 4 made from another metal sheet is applied to the carrier 7. A film with a conductive layer would alternatively be conceivable as a second electrode also in this case. An air gap 12 is formed between the first component 1, in particular between its first electrode 3, and between the second component 2, in particular its second electrode 4. The second electrode 4 is electrically contacted via a contact spring 16. The first electrode 3 and the second electrode 4 are disposed facing each other and are spaced apart from each other by the air gap 12. Under the influence of an actuating force acting on the actuating surface 6, the first electrode 3 undergoes a displacement, moving it closer to the second electrode 4, against an elastic restoring force. This is caused by tappets 18 of the first component 1 acting upon actuation on cantilevered portions of the second electrode formed as tongues, which are subjected to an elastic deformation due to the action and thus act in a restoring manner on the first component 1. The tappets 18 could alternatively be formed in an elastically deformable manner, thus causing a restoring action. A guide 22 with a restricting link 24 is further provided in order to obtain in the non-actuated position (rest position), i.e., in the state of maximum distance between the first component 1 and the second component 2, a specified positioning between these components and thus of the associated two electrodes 3 or 4. Fluctuations of the measuring capacitance determined by the two electrodes 3, 4 and their relative orientation are thus minimized in the rest position. In the shown embodiment, this restricted orientation is obtained by an engagement between the first component 1 and the second component 2 in which a wedge-shaped tab 23 of the first component 1 engages a groove 24 in the rest position, which narrows in a wedge-shaped manner towards its bottom and is provided on a projection formed by the second component 2.

The movement closer to each other is limited to a minimum distance by stops 19 so that a touching contact between the first electrode 3 and the second electrode 4 is excluded. This movement closer to each other is detected capacitively. A detection and evaluation unit 10 for applying a measuring capacitance to the first electrode 3 and the second electrode 4 is provided therefor. The detection and evaluation unit 10 is provided to associate the actuation with a switching or controlling function upon detecting a change in measuring capacitance dependent on the displacement moving the first electrode 3 and the second electrode 4 closer to each other. The detection and evaluation unit 10 mounted on a printed circuit board 9 which in turn is attached to a housing 8, in this case a housing frame, belonging to the input device. The unit consisting of the first component 1 and the second component 2 is movably supported in an elastically restoring manner in a direction parallel to the actuating surface 6. Several leaf springs 15 are provided therefor which provide for the horizontal mobility while at the same time providing the restoring action. This mobility of the first component 1 and the second component 2 is used to enable a tactile feedback by an actuated stimulation of movement H of the actuating surface 6 when a minimum actuating force is exceeded. The associated actuator is not depicted.

Reference should also be had to the appended claims. Features cited individually in the appended claims can be combined with each other in any technologically meaningful manner and represent other embodiments of the present invention. The description, in particular in connection with the drawings, additionally characterizes and specifies the present invention.

What is claimed is:

1. An input device comprising:
    a first component comprising an actuating layer and a first electrode arranged adjacent to the actuating layer, the actuating layer defining an actuating surface;
    a second component comprising a carrier and a second electrode, the first electrode and the second electrode being arranged to face each other;
    an air gap arranged between the first electrode and the second electrode;
    a fastener configured to connect the first component and the second component;
    a device configured to electrically contact the first electrode and the second electrode; and
    a detection and evaluation unit,
    wherein,
    the first electrode, under an influence of an actuating force acting on the actuating surface undergoes, upon an actuation, a displacement so as to move the first electrode closer to the second electrode against an elastic restoring force,
    the detection and evaluation unit is configured to apply a measuring capacitance to the first electrode and to the second electrode, and to detect a change in the measuring capacitance dependent on the displacement moving the first electrode and the second electrode closer to each other in order to associate the actuation with a switching or controlling function after detecting a predetermined change in the measuring capacitance, and
    the first electrode is attached over its entire surface on the actuating layer via at least one of a non-positive connection and a substance-to-substance connection.

2. The input device as recited in claim 1, further comprising:
    an electrically insulating protective layer,
    wherein, the electrically insulating protective layer is also arranged between the first electrode and the second electrode.

3. The input device as recited in claim 1, wherein the elastic restoring force is provided by an elastic deformation of the first component or by an elastic deformation of the second component.

4. The input device as recited in claim 3, wherein,
    the first component further comprises tappets, the elastic deformation of the first component is provided by the actuating layer or by the tappets acting on the second component, and the elastic deformation of the second component is provided by the second electrode.

5. The input device as recited in claim 1, wherein at least the carrier and the actuating layer are made of a plastic.

6. The input device as recited in claim 1, wherein at east one of the first electrode and the second electrode is made of a conductive plastic.

7. The input device as recited in claim 1, wherein at least one of the first electrode and the second electrode is defined by a film.

8. The input device as recited in claim 7, wherein the film is a single-ply film.

9. The input device as recited in claim 1, wherein at least one of the first electrode and the second electrode is defined by a metallic coating or by a metal sheet.

10. The input device as recited in claim 1, further comprising:

spacers arranged in some areas in the air gap, the spacers being connected to at least one of the first component and to the second component by the at least one of the non-positive connection and the substance-to-substance connection or are formed integrally therewith.

11. The input device as recited in claim 1, wherein the device configured to electrically contact the first electrode and the second electrode comprises a flexible conductor path.

12. The input device as recited in claim 1, further comprising:

a housing;

a support configured to support the first component and the second component in a movable manner relative to the housing; and an actuator configured to stimulate a movement of the first component and the second component relative to the housing so as to generate a tactile feedback.

13. The input device as recited in claim 12, wherein the support is provided as spring plates.

14. The input device as recited in claim 12, wherein the device configured to electrically contact the first electrode and the second electrode comprises the support.

15. The input device as recited in claim 1, wherein at least one of the first component and the second component further comprises an array of electrodes which are electrically insulated from each other.

16. The input device as recited in claim 15, wherein only the first component further comprises the array of electrodes which are electrically insulated from each another.

17. A method of using the input device as recited in claim 1, the method comprising:

providing the input device as recited in claim 1; and using the input device in a motor vehicle.

18. A method for producing the input device as recited in claim 1, the method comprising:

producing the first component and the second component in independent steps; and connecting the first component and the second component with each other in a subsequent connecting step.

19. The method as recited in claim 18, wherein at least one of the first component and the second component are produced via a 2K injection-molding process or via an injection-molding process injection which overmolds the respective first electrode and second electrode.

* * * * *